United States Patent
Richardson

(10) Patent No.: US 7,569,834 B1
(45) Date of Patent: Aug. 4, 2009

(54) HIGH RESOLUTION CHARGED PARTICLE PROJECTION LENS ARRAY USING MAGNETIC ELEMENTS

(75) Inventor: Neil Richardson, Palo Alto, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 335 days.

(21) Appl. No.: 11/550,762

(22) Filed: Oct. 18, 2006

(51) Int. Cl.
*H01J 37/14* (2006.01)
*H01J 37/20* (2006.01)

(52) U.S. Cl. .................. 250/396 ML; 250/396 R; 250/492.2

(58) Field of Classification Search .................. None
See application file for complete search history.

(56) References Cited

U.S. PATENT DOCUMENTS

| | | | | |
|---|---|---|---|---|
| 6,750,455 B2 * | 6/2004 | Lo et al. | .................. | 250/346 |
| 6,897,458 B2 | 5/2005 | Wieland et al. | .......... | 250/494.1 |
| 6,919,952 B2 | 7/2005 | Kruit | .................. | 355/67 |
| 7,084,414 B2 | 8/2006 | Wieland et al. | ........ | 250/492.23 |
| 7,091,504 B2 | 8/2006 | Wieland et al. | .......... | 250/494.1 |

OTHER PUBLICATIONS

N. William Parker, Alan D. Brodie and John H. McCoy, "A High Throughput NGL Electron Beam Direct-Write Lithography System", Proceedings of SPIE, Emerging Lithographic Technologies IV, Jul. 2000, vol. 3997, p. 713-720.

* cited by examiner

*Primary Examiner*—David A. Vanore
(74) *Attorney, Agent, or Firm*—Joshua D. Isenberg; JDI Patent

(57) ABSTRACT

A charged particle optic apparatus for improvement in resolution of an electrostatic, multi-beam column is disclosed. The charged particle optic apparatus includes an electrostatic lens array having a first plurality of apertures and a first magnetic pole piece disposed proximate the electrostatic lens array. The first magnetic pole piece includes a second plurality of apertures. The charged particle optic apparatus also includes a second magnetic pole piece disposed proximate the electrostatic lens array such that the electrostatic lens array is between the first magnetic pole piece and the second magnetic pole piece. The second magnetic pole piece includes a third plurality of apertures. The first, second and third pluralities of apertures are aligned with each other. The charged particle optic apparatus may be implemented in a charged particle beam system.

28 Claims, 3 Drawing Sheets

HIGH RESOLUTION CHARGED PARTICLE PROJECTION LENS ARRAY USING MAGNETIC ELEMENTS

FIELD OF THE INVENTION

This invention generally relates to charged particle beam systems and more particularly to a charged particle optical apparatus that improves the resolution of charged particle beams from an electrostatic, multi-beam column.

BACKGROUND OF THE INVENTION

Several kinds of electron beam exposure systems are known in the art. Most of these systems are provided to transfer very precise patterns onto an exposed surface of a substrate. Since lithography features are pushed to become smaller and smaller following Moore's law, the high resolution of electron beams could be used to continue the drive to even smaller features. Electron beam lithography, metrology and inspection systems have historically suffered from low throughput and limited focal length and resolution. A conventional electron beam exposure apparatus has a throughput of about 1/100 wafer/hr. However, for lithography purposes a commercially acceptable throughput of at least a few wafer/hr is necessary. For lithography, metrology and inspection systems resolution of nanometer-scale features requires a beam spot size significantly smaller than the features being resolved. To achieve such small spot sizes, smaller focal lengths are often desirable.

One possible solution to these limitations involves an approach using many beams writing simultaneously. For example, U.S. Pat. No. 6,897,458, U.S. Pat. No. 7,091,504 and U.S. Pat. No. 7,804,414 disclose multi-beam projection columns for mask-less electron-beam lithography and inspection. These multi-beam projection columns are composed of carefully aligned arrays of apertures and entirely electrostatic focusing and deflection elements. Multiple electron beams are formed by illuminating an array of apertures with electrons from a high current, high brightness electron gun which typically has a large area cathode. Alternatively, multiple discrete electron sources can be used but these tend to be difficult to control and align.

For single-column multi-beam systems, including projection optics and blanked apertures arrays, throughput, focal length and resolution may be limited by space-charge effects. The smallest achievable beam diameter for useful current (about 1 nA) in a conventional multi-beam system may be on the order of tens of nanometers, limited mainly by chromatic aberration in the electrostatic projection lens arrays. The chromatic aberration coefficient of the lens scales with the focal length. However, the focal length of such lenses can not be reduced beyond a certain practical limit or the electric field strength between lens electrodes becomes impractical to maintain without flashover.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the embodiments of the invention described below are set forth without any loss of generality to, and without imposing limitations upon, the claimed invention.

Figure 1:
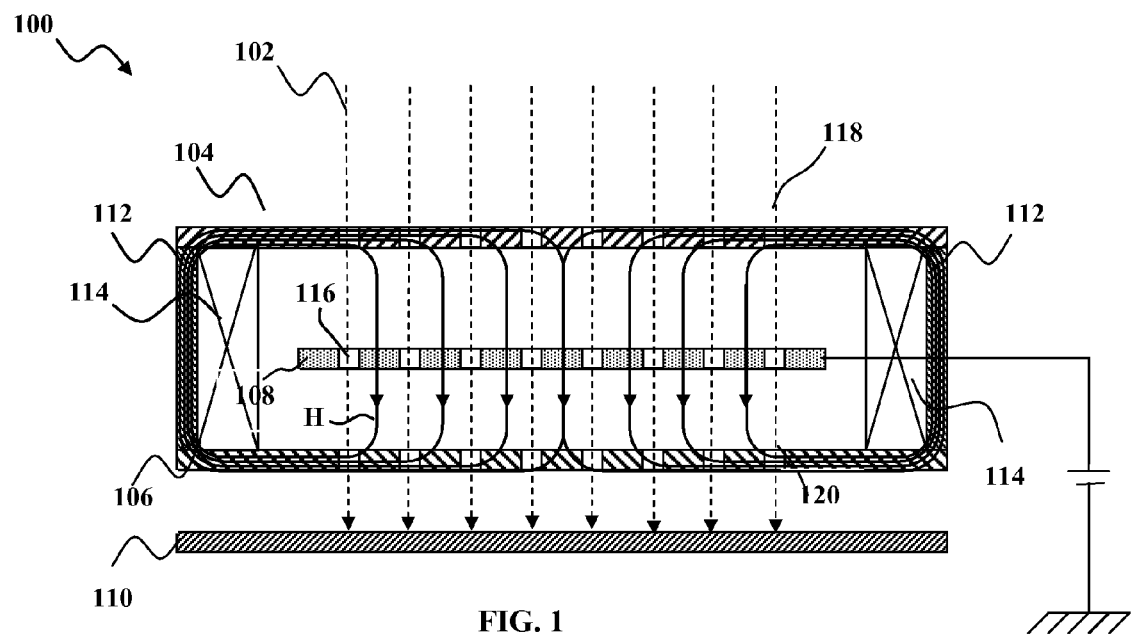
FIG. 1 is a cross-sectional schematic diagram of a charged particle optic apparatus according to a first embodiment of the present invention.

A charged particle apparatus 100 according to an embodiment of the present invention is schematically shown in FIG. 1. The charged particle optic apparatus 100 includes an electrostatic lens array 108 having a first plurality of apertures 116 and a first magnetic pole piece 104 disposed proximate the electrostatic lens array 108. The first magnetic pole piece 104 includes a second plurality of apertures 118 that are aligned with corresponding apertures in the first plurality of apertures 116 in the electrostatic lens array 108. The charged particle optic apparatus 100 also includes a second magnetic pole piece 106 disposed proximate the electrostatic lens array 108 such that the electrostatic lens array 108 is between the first magnetic pole piece 104 and the second magnetic pole piece 106. The second magnetic pole piece 106 includes a third plurality of apertures 120 that are aligned with corresponding apertures in the first plurality of apertures 116 in the electrostatic lens array 108. The electrostatic lens array 108 and the first and second magnetic pole pieces 104 and 106 are disposed on one side of a target 110. The first, second and third pluralities of apertures 116, 118 and 120 are aligned with each other so that the charged particle beam 102 can go through all of these components and focus on an exposure surface of the target 110. By way of example, and without limitation, the charged particle beams 102 may be electron beams or ion beams. A pitch between two apertures 116, or 118 or 120 may be between about 100 μm and about 1000 μm. The diameter of the apertures 116, 118 and 120 may be between about 5 μm and about half the pitch, e.g., between about 5 μm and about 25 μm, preferably between about 10 μm and about 20 μm. A voltage may be applied to the electrostatic lens array to provide an electrostatic lens effect on charged particle beams. The two pole pieces 104, 106 may be held at the same electric potential as each other but at a different electric potential than the electrostatic lens array 108. Such a configuration is sometimes referred to as an "Einzel" lens array.

The first and second magnetic pole pieces 104 and 106 produce a magnetic flux density H that is parallel to optical axes of charged particle beam in a space occupied by the electrostatic lens array 108. If the magnetic flux density H is sufficiently strong it may counteract the tendency of the charged particle beam to spread or de-focus due to "space-charge" effects. By counteracting such space-charge effects, the charged particle optic apparatus 100 may achieve a shorter focal length than would otherwise be possible without the magnetic flux H. In the example shown in FIG. 1, the electrostatic lens array 108 and the first and second magnetic pole pieces 104 and 106 may be flat plates, and the first, second and third pluralities of apertures 116, 118 and 120 are formed through the flat plates. The first and second magnetic pole pieces 104 and 106 may be made of a magnetic material, e.g., soft iron, nickel-iron alloys, e.g., µ-metal, iron-cobal alloys, e.g., Hyperco, and the like.

The charged particle optic apparatus 100 may also include a source of magnetic flux 114 for producing a magnetic field that is guided by the first and second magnetic pole pieces 104 and 106 to provide the desired flux density H. The source of magnetic flux 114 may be one or more lens coils or permanent magnets. In addition, the charges particle optic apparatus 100 includes magnetically permeable yoke 112 that helps confine the magnetic flux H to the pole pieces 104, 106 and the region between the first and the second magnetic pole pieces 104 and 106.

Figure 2:
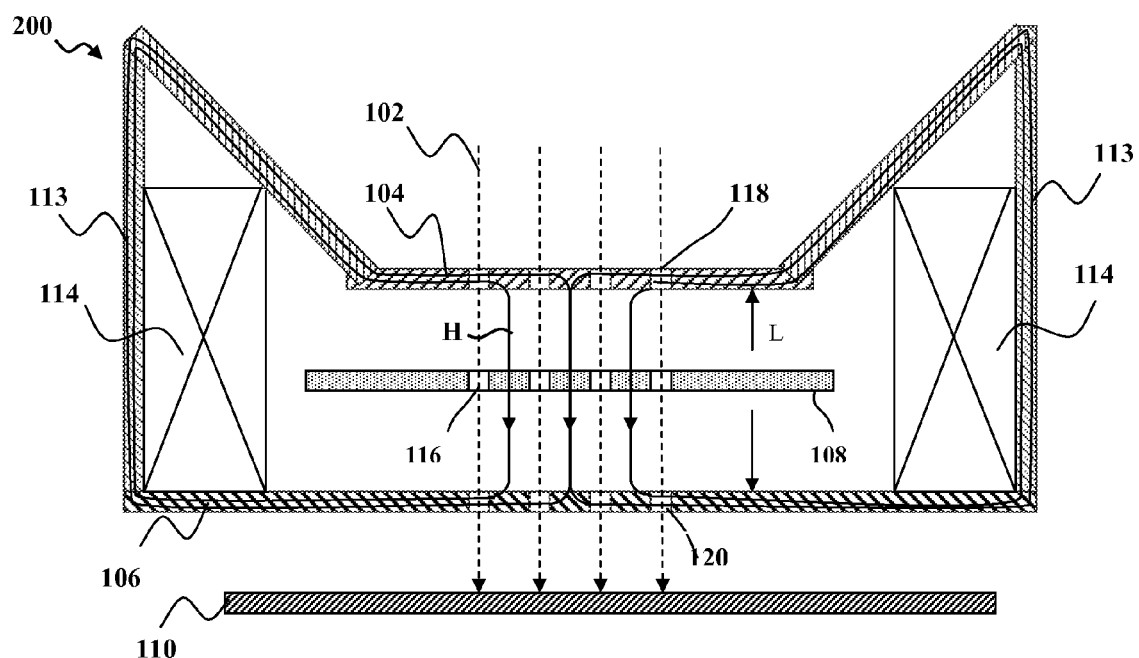
FIG. 2 is a cross-sectional schematic diagram of a modified charged particle optic apparatus with a magnetically permeable yoke for improvement of the magnetic efficiency according to an alternative embodiment of the invention.

FIG. 2 is a cross-sectional schematic diagram illustrates a charged particle apparatus 200 that is a modified version of the charged particle optic apparatus 100 described in FIG. 1. As shown in FIG. 2, a magnetically permeable yoke 113 couples magnetic flux to the first and second magnetic pole pieces 104 and 106, which allows a distance L between the first and the second magnetic pole pieces 104 and 106 to be smaller than a length of the source of magnetic flux 114. The shape of the yoke 113 and shortened distance L allows for stronger electric fields between the pole pieces 104, 106 and the electrostatic lens array 108.

Figure 3:
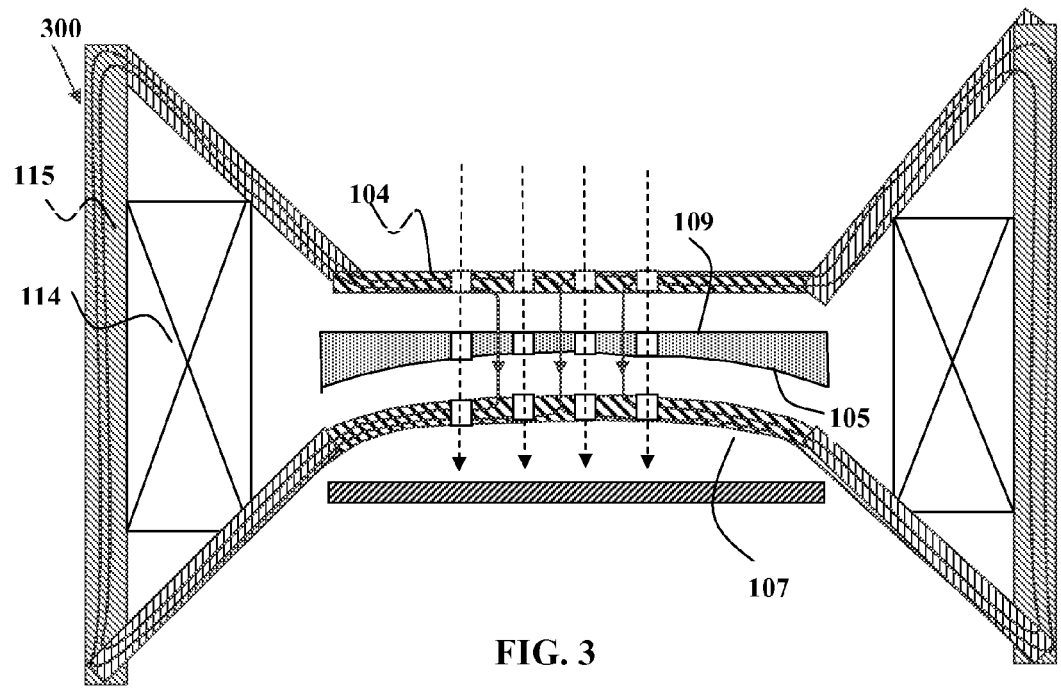
FIG. 3 is a cross-sectional schematic diagram illustrating a charged particle optic apparatus having concave electrostatic lens array and concave second magnetic pole piece according to another alternative embodiment of the invention.

FIG. 3 is a cross-sectional schematic diagram of another charged particle apparatus 300 that is another modified version of the charged particle optic apparatus 100 described in FIG. 1. As shown in FIG. 3, the apparatus 300 includes an electrostatic lens array 109 with a plate having a flat surface proximate the first magnetic pole piece 104 and a concave surface proximate a second magnetic pole piece 107. The second magnetic pole piece 107 also is a concave plate. The concave shapes of the surface 105 of the electrostatic lens array 109 and the second magnetic pole piece 107 may be selected to produce a constant drop in magnetomotive force across a gap between the first and second magnetic pole pieces 104 and 107. The apparatus 300 may include a magnetically permeable yoke 115 having a shape chosen to shorten the distance between the pole pieces 104, 107 to allow for stronger electric fields between the pole pieces 104, 107 and the electrostatic lens array 109.

Figure 4:
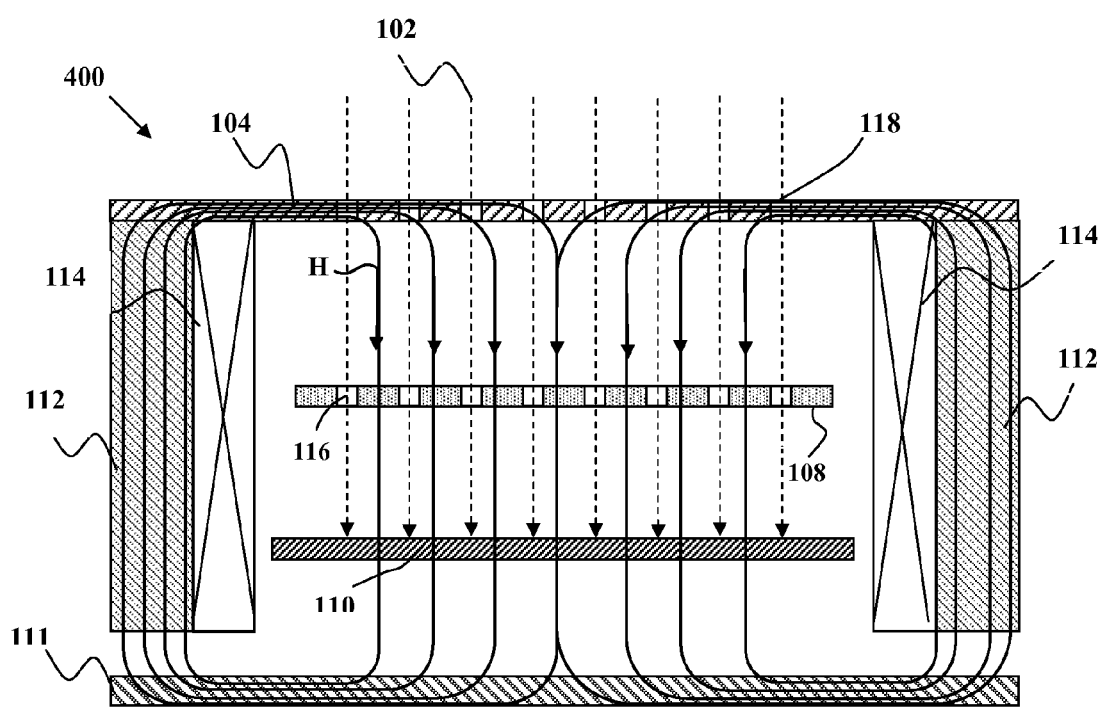
FIG. 4 is a cross-sectional schematic diagram illustrating a magnetic immersion lens version of the charged particle optic apparatus according to a second embodiment of the present invention.

FIG. 4 is a cross-sectional schematic diagram illustrates another charged particle optic apparatus 400, according to a second embodiment of the present invention. The apparatus 400 is an immersion lens version of the charged particle optic apparatus 100 described in FIG. 1. The charged particle optic apparatus 400 includes the electrostatic lens array 108 and first magnetic pole piece 104 as described above with respect to the charged particle optic apparatus 100. The apparatus 400 further includes a second pole piece 111 arranged with the electrostatic lens array 108 disposed between the first and second pole pieces 104, 111. However, in the apparatus 400 the second magnetic pole piece 111 does not include a plurality of apertures and is disposed on one side of a target 110 while the electrostatic lens array 108 and the first magnetic pole piece are disposed on an opposite site of the target 110. The target 110 may therefore be "immersed" in the magnetic flux guided by the pole pieces 104, 111.

Figure 5:
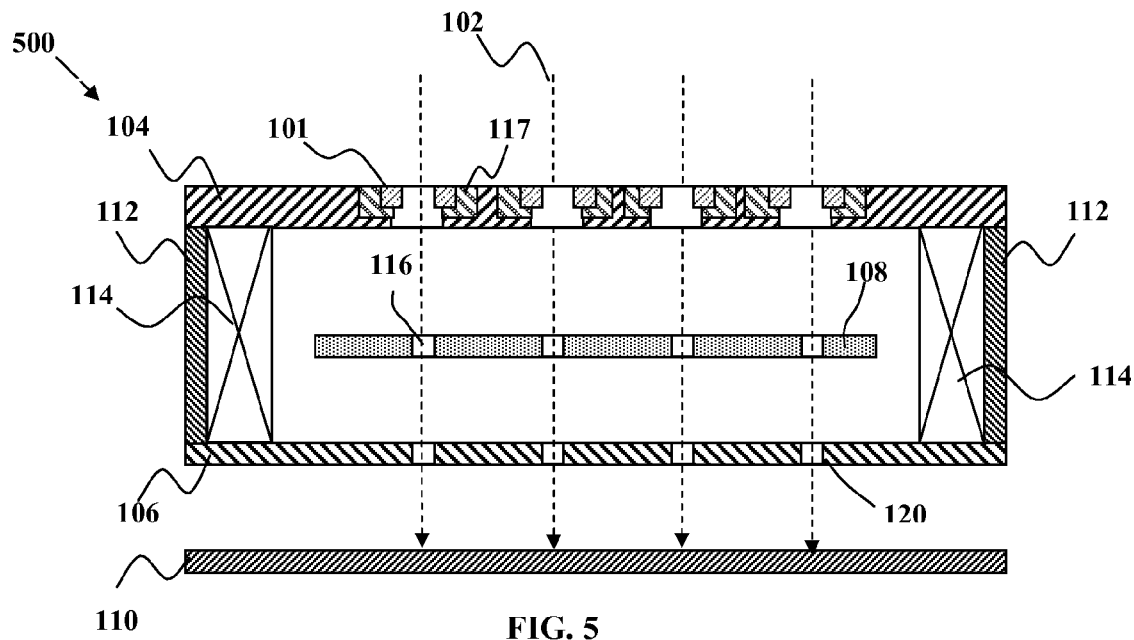
FIG. 5 is a cross-sectional schematic diagram of a charged particle optic apparatus having charged particle detectors for detection of secondary charged particle according to another embodiment of the present invention.

Charged particle optic apparatus of the types described above may be used in charged particle beam inspection and/or metrology systems. For example, FIG. 5 is a cross-sectional schematic diagram of a charged particle optic apparatus 500 having charged particle detectors for detection of secondary charged particles. As shown in FIG. 5, a charged particle optic apparatus of the type described in FIG. 1 includes charged particle detectors 101 for detection of secondary charged particles, e.g., secondary electrons. The charged particle detectors 101 may include collection rings and/or charged-particle multipliers disposed proximate the second plurality of apertures 118 of the first magnetic pole piece 104. The charged particle detectors 101 may be made of metal or other electrically conductive material. To electrically isolate the detectors 101 from each other, electro isolators 117 may be disposed between the charged particle detectors 101 and the first magnetic pole piece 104 to prevent electrical connection between the charged particle detectors 101 and the first magnetic pole piece 104. Charged particle detectors can be implemented for other versions of the charged particle optic apparatus described in FIGS. 2-4.

Figure 6:
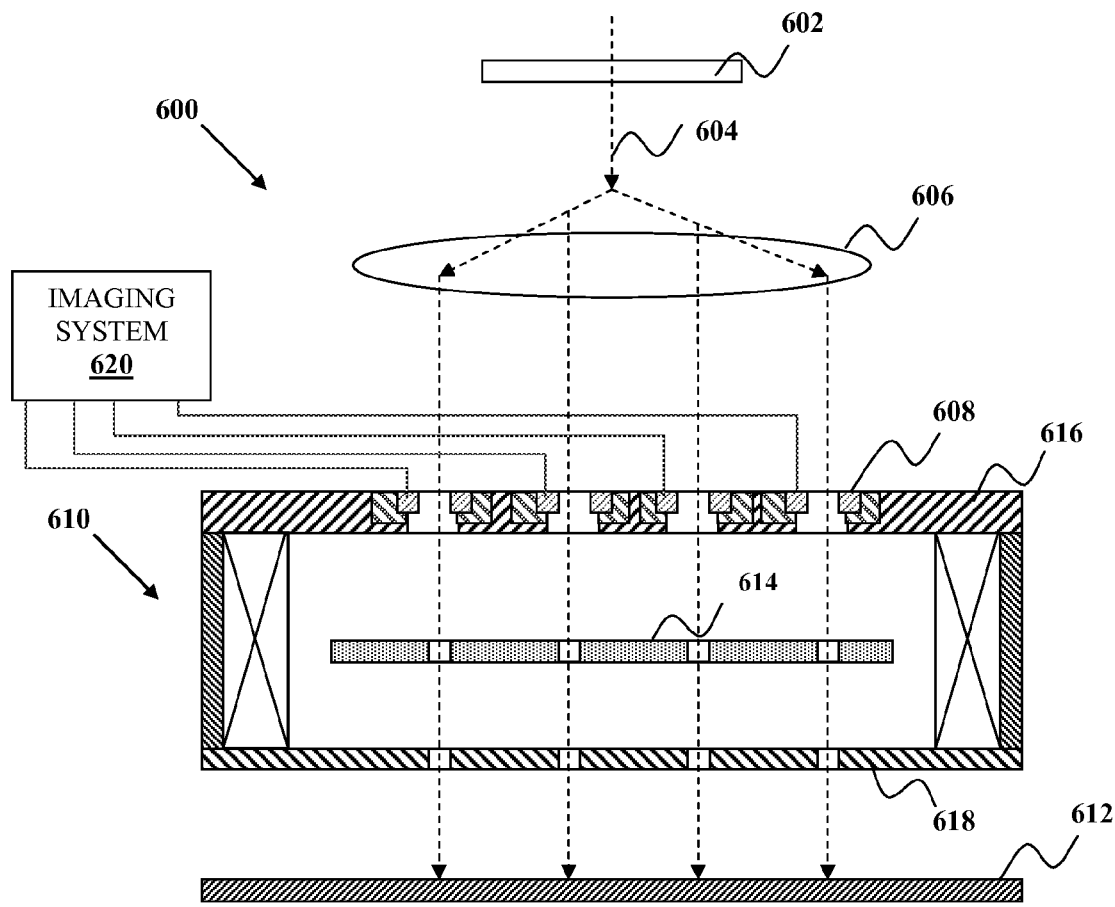
FIG. 6 is a schematic diagram illustrating a charged particle beam system according to a third embodiment of the present invention.

The charged particle optic apparatus of the present invention is implemented into a charged particle beam system, e.g., an electron beam system or ion beam system. FIG. 6 is a schematic diagram of an example of a charged particle beam system 600 according to another embodiment of the present invention. The charged particle beam system 600 may include one or more sources 602 for emitting charged particles, an optical condenser 606 for collimating the charged particle beam 604, and an objective lens 610 for producing a substantially uniform magnetic field parallel to charged particle optical path. The optical condenser 606 may include a lens array. The objective lens 610 is a charged particle optic apparatus of the types described with respect to FIG. 1 through FIG. 5. By way of example and without limitation, a charged particle optic apparatus of the type described in FIG. 5 is illustrated as the objective lens 610 in FIG. 6. The objective lens 610 basically includes an electrostatic lens array 614 having a first plurality of apertures, which is disposed between a first magnetic pole piece 616 having a second plurality of apertures that are aligned with the first plurality of apertures of the electrostatic lens array 614 and a second magnetic pole piece 618. The objective lens 610 may also include charged particle detectors 608 disposed proximate the second plurality of apertures of the first magnetic pole piece 616 for detection of secondary charged particles. The charged particle detectors 608 may be coupled to an imaging system 620 to facilitate building up an image of the target 612 from the detection of secondary charged particles, e.g., secondary electrons, which are emitted by the target 612 by an interaction with the incident charged particle beams 604.

The charged particle beams 604 from charge particle sources 602 may be collimated by the optical condenser 606. The collimated charged particle beam 604 then pass through the objective lens 610, which produces a substantially uniform magnetic field parallel to the charged particle optical path, and focus on an exposure surface of a target 612. The resolution (spot size) on the target 612 can be decreased below the previous practical limit of about 40 nm to below 10 nm, while the electrostatic field strength applied to the electrostatic lens array 614 can be reduced, resulting in better immunity to flashover.

Embodiments of the present invention allow for shorter focal lengths and improved resolution in multi-beam charged particle optics at relatively low voltages. Embodiments of the invention may facilitate multi-beam lithography, metrology and inspection beyond the 45-nm lithography node.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A charged particle optic apparatus, comprising:
   an electrostatic lens array having a first plurality of apertures, wherein the electrostatic lens array includes a plate wherein the first plurality of apertures is formed through the plate; and a first magnetic pole piece disposed proximate the electrostatic lens array, wherein the first magnetic pole piece includes a second plurality of apertures that are aligned with the first plurality of apertures.

2. The charge particle optic apparatus of claim 1 further comprising a second magnetic pole piece disposed proximate the electrostatic lens array such that the electrostatic lens array is between the first and second magnetic pole pieces.

3. The charged particle optic apparatus of claim 2, wherein the first and second magnetic pole pieces are adapted to produce a magnetic flux density parallel to optical axes of charged particle beam in a space occupied by the electrostatic lens array.

4. The charge particle optic apparatus of claim 2, wherein the second magnetic pole piece includes a third plurality of apertures that are aligned with the first and second pluralities of apertures.

5. The charged particle optic apparatus of claim 2, wherein the electrostatic lens array includes a flat plate.

6. The charged particle optic apparatus of claim 2, wherein the first and the second magnetic pole pieces are flat.

7. The charged particle optic apparatus of claim 2, wherein the electrostatic lens array and the first magnetic pole piece are disposed on one side of a target, and the second magnetic pole piece is disposed on an opposite site of the target.

8. The charged particle optic apparatus of claim 4, wherein the electrostatic lens array and the first and second magnetic pole pieces are disposed on one side of a target.

9. The charged particle optic apparatus of claim 4, wherein the electrostatic lens array includes a plate having a flat surface proximate the first magnetic pole piece and a concave surface proximate the second magnetic pole piece.

10. The charged particle optic apparatus of claim 9, wherein the second magnetic pole piece is concave.

11. The charged particle optic apparatus of claim 10, wherein the first and second pole pieces are configured that a constant drop in magnetomotive force is produced across a gap between the first and second magnetic pole pieces.

12. The charged particle optic apparatus of claim 2, wherein the first and second magnetic pole piece include magnetic material.

13. The charged particle optic apparatus of claim 2, further comprising a source of magnetic flux adapted to produce a magnetic field guided by the first and second magnetic pole pieces.

14. The charged particle optic apparatus of claim 13, wherein the source of magnetic flux includes one or more lens coils.

15. The charged particle optic apparatus of claim 13, wherein the source of magnetic flux includes one or more permanent magnets.

16. The charged particle optic apparatus of claim 13 further comprising a magnetically permeable yoke, wherein the magnetically permeable yoke couples the magnetic flux to the first and second magnetic pole pieces.

17. The charged particle optic apparatus of claim 16, wherein magnetically permeable yoke allows distance between the first and second magnetic pole pieces to be smaller than a length of the source of the magnetic flux.

18. The charged particle optic apparatus of claim 1 further comprising charged particle detectors disposed proximate the second plurality of apertures for detection of secondary charged particle.

19. The charged particle optic apparatus of claim 1, wherein a pitch between the apertures between about 100 µm and about 1000 µm.

20. The charged particle optic apparatus of claim 19, wherein the apertures have diameter between 5 µm and about half the pitch.

21. The charged particle optic apparatus of claim 20, wherein the apertures have diameter between about 5 µm and about 25 µm.

22. The charged particle optic apparatus of claim 21, wherein the apertures have diameter between about 10 µm and about 20 µm.

23. A charged particle beam system, comprising:
   one or more sources for emitting charged particle;
   an optical condenser adapted to collimate the charged particle;
   an objective lens comprising:
   an electrostatic lens array having a first plurality of apertures; and
   a first magnetic pole piece disposed proximate the electrostatic lens array, wherein the first magnetic pole piece includes a second plurality of apertures that are aligned with the first plurality of apertures.

24. The charged particle beam system of claim 23, wherein the objective lens further comprising a second magnetic pole piece disposed proximate the electrostatic lens array such that the electrostatic lens array is between the first and second magnetic pole pieces.

25. The charged particle beam system of claim 24, wherein the second magnetic pole piece includes a third plurality of apertures that are aligned with the first and second pluralities of apertures.

26. The charged particle beam system of claim 23, wherein the objective lens further comprising charged particle detectors disposed proximate the second plurality of apertures for a detection of the secondary charged particle.

27. The charged particle beam system of claim 23, wherein the objective lens produces a substantially uniform magnetic filed parallel to charged particle optical path.

28. The multi-electron beam inspection system of claim 23, where in the optical condenser includes a lens array.

* * * * *